United States Patent [19]

Wong et al.

[11] Patent Number: 6,081,004

[45] Date of Patent: *Jun. 27, 2000

[54] BICMOS COMPACTED LOGIC ARRAY

[75] Inventors: Anthony Y. Wong, Saratoga; Anna Tam, Cupertino; Daniel Wong, San Jose, all of Calif.

[73] Assignee: LSI Logic Corp., Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/410,375

[22] Filed: Mar. 27, 1995

Related U.S. Application Data

[63] Continuation of application No. 08/014,084, Feb. 4, 1993, abandoned, which is a continuation of application No. 07/754,201, Aug. 19, 1991, abandoned, which is a continuation of application No. 07/523,445, May 14, 1990, abandoned.

[51] Int. Cl.[7] .................................................. H01L 27/10
[52] U.S. Cl. .......................... 257/205; 257/206; 257/370; 257/378; 257/499
[58] Field of Search ................................ 357/42, 45, 43; 257/202, 204, 205, 206, 207, 208, 210, 211, 370, 378, 499

[56] References Cited

U.S. PATENT DOCUMENTS 4,884,118 11/1989 Hui et al. .................................. 357/42

FOREIGN PATENT DOCUMENTS 91 10 7314 8/1989 European Pat. Off. .

OTHER PUBLICATIONS

"A 200k Gate 0.8 μm Mixed CMOS/BiCMOS Sea–of–Gates", IEEE International Solid–State Circuits Conference, Session 5, Feb. 15, 1990, Y. Enomoto et al., *IEEE* 1990.

A 350 ps 50K 0.8 μm BiCMOS Gate Array With Shared Bipolar Cell Structure, H. Hara et al., IEEE 1989 Custom Integrated Circuits Conference, *IEEE* 1990.

Proceedings of the IEEE 1987 Custom Integrated Circuits Conference, May 4, 1987, Oregon, U.S.A., pp. 190–194, "A 9100 Gate ECL/TTL Compatible BICMOS Gate Array", Liang–Tsai Lin et al., pp. 192–193, IEEE 1987 Custom Integrated Circuits Conference.

*Primary Examiner*—Jerome Jackson, Jr.
*Assistant Examiner*—Bradley William Baumeister

[57] ABSTRACT

A repeating cell structure in a semiconductor substrate for a BiCMOS logic gate array. The cell structure has three regions shaped as columns. The first columnar region is a P-well and has four vertically aligned active areas of N-type material formed within the columnar region. Each of the active areas has two gate electrodes to form two NMOS transistors. Similarly the second columnar region is a N-well and has four vertically aligned active areas of P-type material. Each such active region forms two PMOS transistors. The third column has two bipolar transistors, each with collector, base and emitter regions vertically aligned. The resulting BiCMOS logic array permits a flexible location of macrocells, which results in a compact implementation of the resulting integrated circuit.

20 Claims, 10 Drawing Sheets

BICMOS COMPACTED LOGIC ARRAY

This is a Continuation of application Ser. No.: 8/014,084, filed Feb. 4, 1993 now abandoned. Which is a Continuation of application Ser. No. 07/754,201 filed Aug. 19, 1991, now abandoned, which is a Continuation of application Ser. No. 07/523,445, filed May 14, 1990, now abandoned.

BACKGROUND OF THE INVENTION

The present invention is related to logic array integrated circuit structures and, more specifically, to BiCMOS logic array integrated circuit structures.

A logic array is an integrated circuit device having an array of partially connected semiconductor devices, most of which are transistors. The integrated circuit is completed by the specification of the layout of the conducting layers, typically two, which interconnect the semiconductor devices. The layout of the conducting layers adapt the generic logic array to the user's specific needs.

Associated with the logic array is a macrocell library which is a compilation of layout patterns for the conducting layers to implement commonly used logic function blocks, such as NAND, NOR, flip-flop, counters and the like, with interconnected semiconductor devices. A user adapts the array by specifying the logic function blocks and their interconnection. The resulting integrated circuit is particularly designed for the user's requirements in this manner.

A constraint for logic arrays is that conducting lines formed by layout patterns must be conserved. Once an area in a conducting metal layer is delineated and used for connecting points within a macrocell, for instance, it is not also available for connecting macrocells to each other.

With this constraint logic arrays are ideally implemented for maximum flexibility and compactness. The logic array should not only be able to compactly realize as many logic function blocks as possible, but also the logic array should be such that a macrocell may be positioned in as many locations in the array as possible. This allows for the different macrocells of the desired integrated circuit to be located closely together for a compact design, a desirable goal in integrated circuits, with the conducting layers between the macrocells available to form the interconnecting conducting lines.

For example, one such flexible and compact logic array design is described in the present assignee's U.S. Pat. No. 4,884,118, entitled "Double Metal HCMOS Compacted Array," issued to A.C. Hui et al. on Nov. 28, 1989. That patent teaches a flexible and high density logic array in CMOS (Complementary Metal Oxide Semiconductor) technology. However, heretofore logic arrays in BiCMOS technology have not been entirely satisfactory in terms of flexibility and compactness. In BiCMOS (Bipolar Complementary Metal Oxide Semiconductor) technology bipolar technology is combined with that of CMOS. In a BiCMOS integrated circuit, the higher-speed bipolar transistors are located at the suitable locations to use the speed and drive capabilities inherent in bipolar transistors. The CMOS transistors are used wherever higher packing densities and lower power consumption of CMOS circuits are suitable.

Thus the present invention is directed toward a BiCMOS logic array which is much more compact and flexible than BiCMOS logic arrays heretofore.

SUMMARY OF THE INVENTION

The present invention provides for a repeating cell structure in a semiconductor substrate for a BiCMOS logic gate array. The cell structure has three regions shaped as columns. The first columnar region is a P-well and has four active areas of N-type material formed within the columnar region such that said active areas in region are aligned vertically with respect to each other. Each of the active areas having a first source/drain region, a second source/drain region, a third source/drain region, a first channel region between said first and second source/drain regions, a gate formed above said first channel region to control the conductivity of said first channel region, a second channel region between said second and third source/drain regions, and a gate formed above said second region to control the conductivity of said second channel region. In other words, each active area forms two NMOS transistors.

The first columnar region also has first and second tap regions for the P-well underlying the NMOS transistors. The first tap region is located between the topmost active region and the active region immediately below said topmost active region, while the second tap region is located between the bottommost active region and the active region immediately above said active region.

The second columnar region has an N-well with also four P-type active areas. The active areas in the second columnar region are aligned vertically with respect to each other and each of the active areas of the second columnar region is aligned horizontally with one of the active areas of said first columnar region. Each of the active areas has a first source/drain region, a second source/drain region, a third source/drain region, a first channel region between said first and second source/drain regions, a gate formed above said first channel region to control the conductivity of said first channel region, a second channel region between said second and third source/drain regions, and a gate formed above said second region to control the conductivity of said second channel region to form two PMOS transistors.

Like the first columnar region, the second columnar region has first and second tap regions to contact the N-well underlying the PMOS transistors. The first tap region is located between the topmost active region and the active region immediately below said topmost active region. The second tap region is located between the bottommost active region and the active region immediately above said active region. Thus the first tap region of the second columnar region aligned horizontally with the first tap region of the first columnar region, and the second tap region of the second columnar region aligned horizontally with the second tap region of the first columnar region.

The third columnar region has an underlying P-substrate to hold two bipolar transistors and one resistor. The collector, base and emitter regions of the first bipolar transistor and the collector, emitter and base regions of said second bipolar transistor are aligned vertically with a tap region to the underlying P-substrate located below the collector, base and emitter regions of the first and second bipolar transistors. For a resistor, the base region of said second bipolar transistor has a diffused resistive region extending from and of the same conductivity type as the base region.

With this cell structure repeated over a semiconductor substrate both vertically and horizontally, a BiCMOS logic array is created which is highly flexible and compact.

BRIEF DESCRIPTION OF THE DRAWINGS

A clear understanding of the present invention may be obtained by a perusal of the following Detailed Description of the Specific Embodiments with reference to following drawings.

It should be noted that the layout drawings of the figures above are not necessarily to the same scale. Rather, the scale is adjusted so as to best make the point with respect to each drawing.

DETAILED DESCRIPTION OF SPECIFIC EMBODIMENTS

Figure 1A:
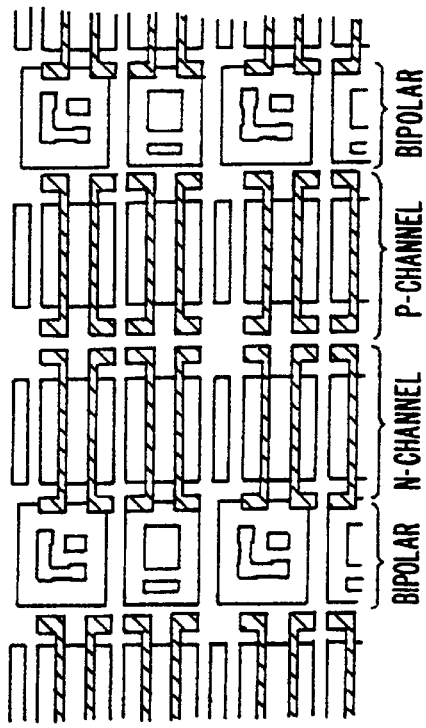
FIG. 1A is a top view layout of a prior art BiCMOS basic cell.
Figure 1B:
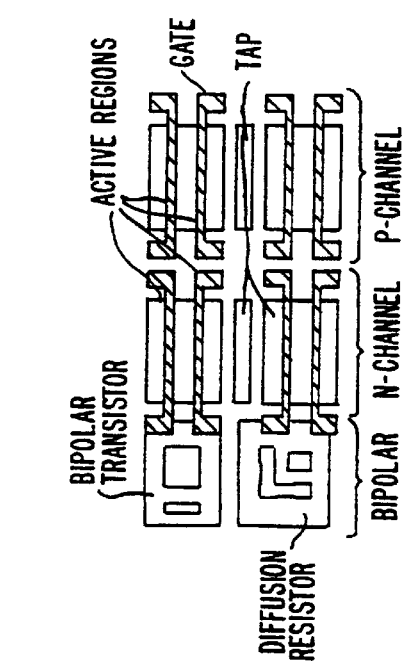
FIG. 1B is partial layout of a logic array using the basic cell of FIG. 1A.

An examination of some prior art BiCMOS logic arrays illustrates the problem of flexibility and compactness in BiCMOS logic arrays. FIG. 1A is a top view of a BiCMOS basic cell for logic array in the prior art. The basic cell is the unit which, repeated over the surface of a semiconductor substrate, creates the logic array. FIG. 1B is a partial logic array created from the basic cell of FIG. 1A which is replicated vertically and horizontally.

In the basic cell of FIG. 1A there is a single bipolar transistor located over a diffusion resistor in the drawing. To the right of the bipolar transistor and resistor are four active regions, each of which is divided by a pair of gate electrodes, which are indicated by solid figures. The active regions and gate electrodes form MOS transistors of N-channel and P-channel types. As shown in FIG. 1A, the two middle active regions (and four gate electrodes) located between the bipolar transistor and diffusion resistor on the left and the two active regions (and four gate electrodes on the right) form a column of N-channel transistors with the gate electrodes over those regions. A tap region, which is necessary for an electrical contact to the semiconductor region underlying the active regions, vertically separates the two middle active regions.

On the other hand, the two active regions on the right form a column of P-channel transistors. A tap region, which is necessary for an electrical contact to the semiconductor region underlying the active regions of the P-channel transistors, also separates those active regions.

Replicated over a semiconductor substrate, the FIG. 1A basic cell forms a logic array layout of repeating columns of bipolar transistors, N-channel MOS (NMOS) transistors, and P-channel MOS (PMOS) transistors, as shown in FIG. 1B. Not shown in these figures are the horizontal and vertical routing tracks along which the conducting layers are delineated into conducting lines overlying the logic array. As in all logic array designs, the FIG. 1A basic cell has a predetermined number of horizontal routing tracks along which conducting lines may be defined and a predetermined number of vertical routing tracks along which conducing lines may be defined.

The problem with the basic cell and logic layout of FIGS. 1A and 1B is that even for a simple logic function, the resulting macrocell typically uses a connection between two horizontally located bipolar transistors. Thus the macrocell uses the routing tracks of a bipolar, N-channel, P-channel and second bipolar column. If a laterally displaced second macrocell is created, the second BiCMOS macrocell must be displaced at least one N-channel and P-channel column away from the first macrocell before the next bipolar column for the second macrocell is reached. Thus assuming, for example, that six routing tracks are located over each of the N-channel and P-channel columns, the area occupied by twelve routing tracks between the two macrocells is used whether or not twelve conducting lines are required in that area.

Furthermore, while two stacked FIG. 1A basic cells appear similar to the basic cell of the present invention, the FIG. 1A basic cells are not able to implement the number of logic functions as can the basic cell of the present invention. Thus assuming semiconductor processing technologies of similar dimensions, the prior art logic arrays occupy greater semiconductor surface area than does a logic array of the present invention.

A further disadvantage of a prior art BiCMOS logic array as shown in FIG. 1B is that many more devices are required to implement relatively simple logic functions than the logic array of the present invention requires. For example, to implement a 2-input NOR gate or 2-input NAND gate, two bipolar transistors and eight active regions (4 N-channel and 4 P-channel) are required in the FIG. 1B logic array. As shown below for a 2-input NOR logic gate, the present invention efficiently uses only two N-channel and two P-channel active regions with two bipolar transistors. This frees the remaining two N-channel and two P-channel active regions in a basic cell for additional logic functions as may be required. This efficient use of devices by the present invention is true for a 2-input NAND gate also.

Figure 2:
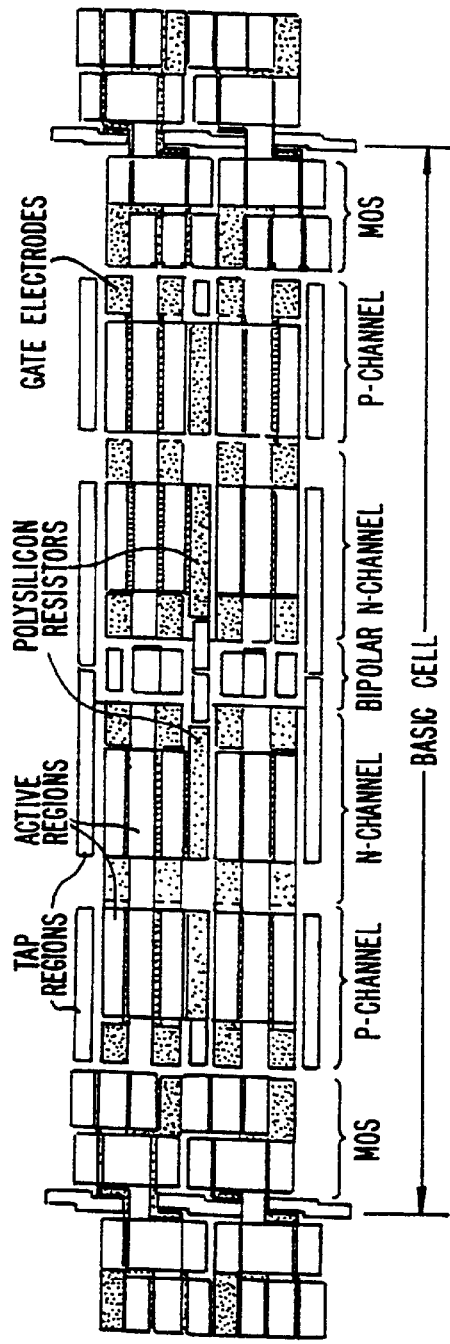
FIG. 2 is a top view layout of a second prior art BiCMOS basic cell.

FIG. 2 is a top view of a second BiCMOS basic cell found in the prior art. Here a central column of two bipolar transistors is flanked on either side by a column of NMOS transistors and a column of PMOS transistors. On both sides at the far edges of the basic cell, there are two columns of smaller-sized NMOS and PMOS transistors. The various regions of the basic cell are indicated in the drawing including active regions, the shaded gate electrodes, polysilicon resistors (also shaded), and tap regions.

The problem of the FIG. 2 basic cell is even worse with respect to the FIG. 1A basic cell which, starting from the left of the figure, laterally occupies a small MOS column, a P-channel column, a N-channel column, a bipolar column, a second N-channel column, a second P-channel column, and a second MOS column. This basic cell can implement most simple logic function macrocells which would be centered about the bipolar column. However, as is evident from an examination of the basic cell, a second laterally displaced macrocell necessarily must be several columns away from the first macrocell whether or not all of the conducting lines defined by the intervening vertical routing tracks between the two macrocells are required.

Figure 3:
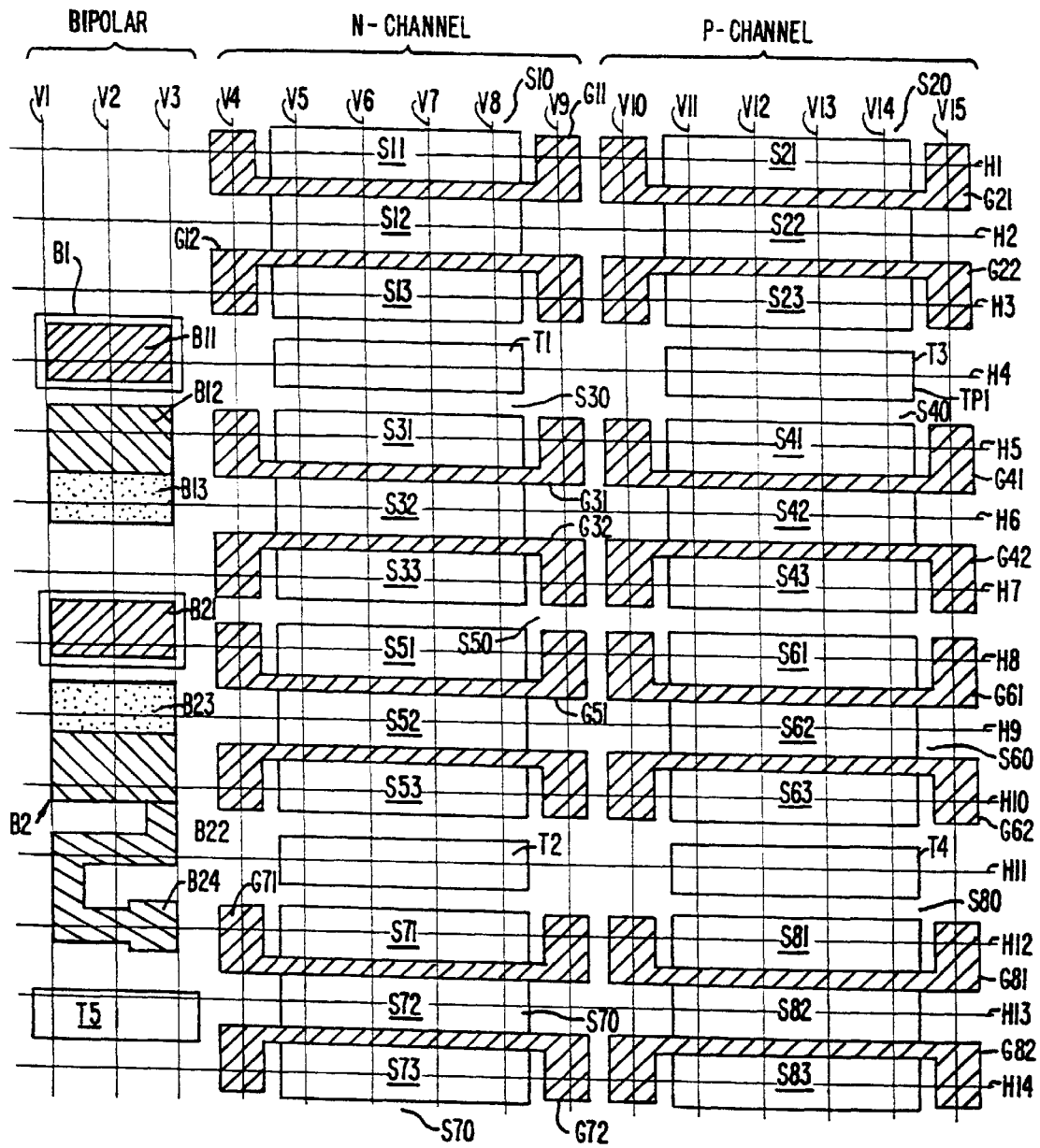
FIG. 3 is a top view layout of a BiCMOS basic cell according to the present invention.

The problems of these prior art basic cells and the advantages of the present invention becomes apparent by an examination of FIG. 3, a top view of a single basic cell of the present invention. This cell is repeated in a stepwise manner both vertically and horizontally over a semiconductor substrate to create a BiCMOS logic array. As shown at the top of FIG. 3, the cell has two columns of MOS transistors, marked N-Channel and P-Channel, and a column of bipolar transistors, marked Bipolar.

The transistors in the N-Channel column are NMOS transistors in a P-well region of the substrate. The P-well region is column-shaped region of P-type dopants; the regions run vertically in FIG. 3 and is not shown in the drawing. Within the P-well there are formed four active regions for the NMOS transistors. These active regions are box-shaped and are outlined by solid lines S10, S30, S50 and S70. Over each box-shaped active region there are two gate electrodes (typically of polysilicon) to break the active region into individual source/drain regions to form two NMOS transistors. The right-hand and left-hand ends of each of the gate electrodes have enlarged areas to serve as possible contact areas for the overlying conducting lines.

The active areas outlined by the lines S10, S30, S50 and S70 are N-doped regions. Of course, the channel regions directly under each of the gate electrodes are part of the P-well and are P-doped.

For example, the active N-doped region outlined by the line S10 has two gate electrodes G11 and G12. The gate electrode G11 separates a source/drain region S11 from a source/drain region S12, and the gate electrode G12 separates the source/drain region S12 from a third source/drain region S13. Two NMOS transistors are thus formed, a first transistor with the source/drain region S11, gate electrode G11 and source/drain region S12, and a second transistor with the source/drain region S12, the gate electrode G12 and the source/drain region S13.

Likewise the active region outlined by the line S30 has two NMOS transistors. The first transistor is formed by a source/drain region S31, a gate electrode G31 and a source/drain region S32; the second transistor is formed by the source/drain region S32, a gate electrode G32 and a source/drain region S33.

The active regions outlined by the lines S50 and S70 also have two NMOS transistors each in a similar fashion.

The N-Channel column also has two tap regions, T1 and T2, which are heavily doped P regions. The tap regions T1 and T2 make electrical contact to the P-well which contains the NMOS transistors.

The P-Channel column has PMOS transistors, i.e., P-channel transistors in a N-well. As in the case for the N-Channel column, the N-well is a column-shaped N-doped region which runs vertically in the figure. The N-well is also not shown in the figure. Within the N-well there are formed four P-doped active regions for the PMOS transistors. These active regions are box-shaped and are outlined by solid lines S20, S40, S60 and S80. Over each box-shaped active there are two gate electrodes to form two NMOS transistors per active region. Of course, it is understood that the channel regions, or those portions of the active areas under the gate electrodes, are N-doped as part of the underlying N-well.

The active P-doped region outlined by the line S20, for example, has two gate electrodes G21 and G22. The gate electrode G21 separates a source/drain region S21 from a source/drain region S22, and the gate electrode G22 separates the source/drain region S22 from a third source/drain region S23. Two PMOS transistors are formed. The first PMOS transistor has the source/drain region S21, gate electrode G21 and source/drain region S22; the second PMOS transistor in that active area defined by the line S20 has the source/drain region S22, the gate electrode G22 and the source/drain region S23.

Likewise the active region outlined by the line S40 has two NMOS transistors. The first transistor is formed by a source/drain region S41, a gate electrode G41 and a source/drain region S42; the second transistor is formed by the source/drain region S42, a gate electrode G42 and a source/drain region S43.

The active regions outlined by the line S60 and S80 also each have two PMOS transistors in a similar fashion.

The P-Channel column also has two highly doped tap regions T3 and T4. These N-doped regions T3 and T4 make electrical contact to the N-well in which the PMOS transistors rest.

The Bipolar column, shown at the left of FIG. 3, of the cell contains two bipolar transistors. The first bipolar transistor B1 has a surface collector region B11, a base region B12 and an emitter region B13 within the base region B12; the second bipolar transistor B2 has a surface collector region B21, a base region B22 and an emitter region B23 within the base region B22. Both transistors have a buried collector region which extends below the base regions B12 and B22 respectively, as is common in integrated circuit bipolar transistor structures. The base region B22 of the second transistor B2 has an extension, a lightly doped region B24, which can act as a resistor. Finally the Bipolar column has a heavily doped P-type tap region T5 which makes an electrical connection to the lightly doped P-type substrate. In this embodiment the bipolar transistors are NPN-type. Thus the collector and emitter regions are N-type, and the base and resistive extension region B24 P-type. All of these collector, base and emitter regions of the two bipolar transistors are vertically aligned, together with the region B24 and the tap region T5.

The routing tracks where conducting lines could be laid over the cell are illustrated by vertical dotted lines V1–V15 and horizontal dotted lines H1–H14. There are six vertical routing tracks over the N-Channel column and six vertical routing tracks over the P-Channel column of the FIG. 3 cell. The Bipolar column has three vertical tracks. As is common in present day integrated technology, the BiCMOS logic array to which the FIG. 3 cell pertains has its conducting lines formed by two layers of metal separated by an insulating layer of silicon dioxide. Each metal layer is delineated by masking techniques to form conducting lines.

The FIG. 3 cell contains enough active devices to act as a macrocell for most logic functions. Properly connected, the cell can implement an inverter, 2-, 3- and even 4-input NAND and NOR logic gates, a latch and the like.

Figure 4:
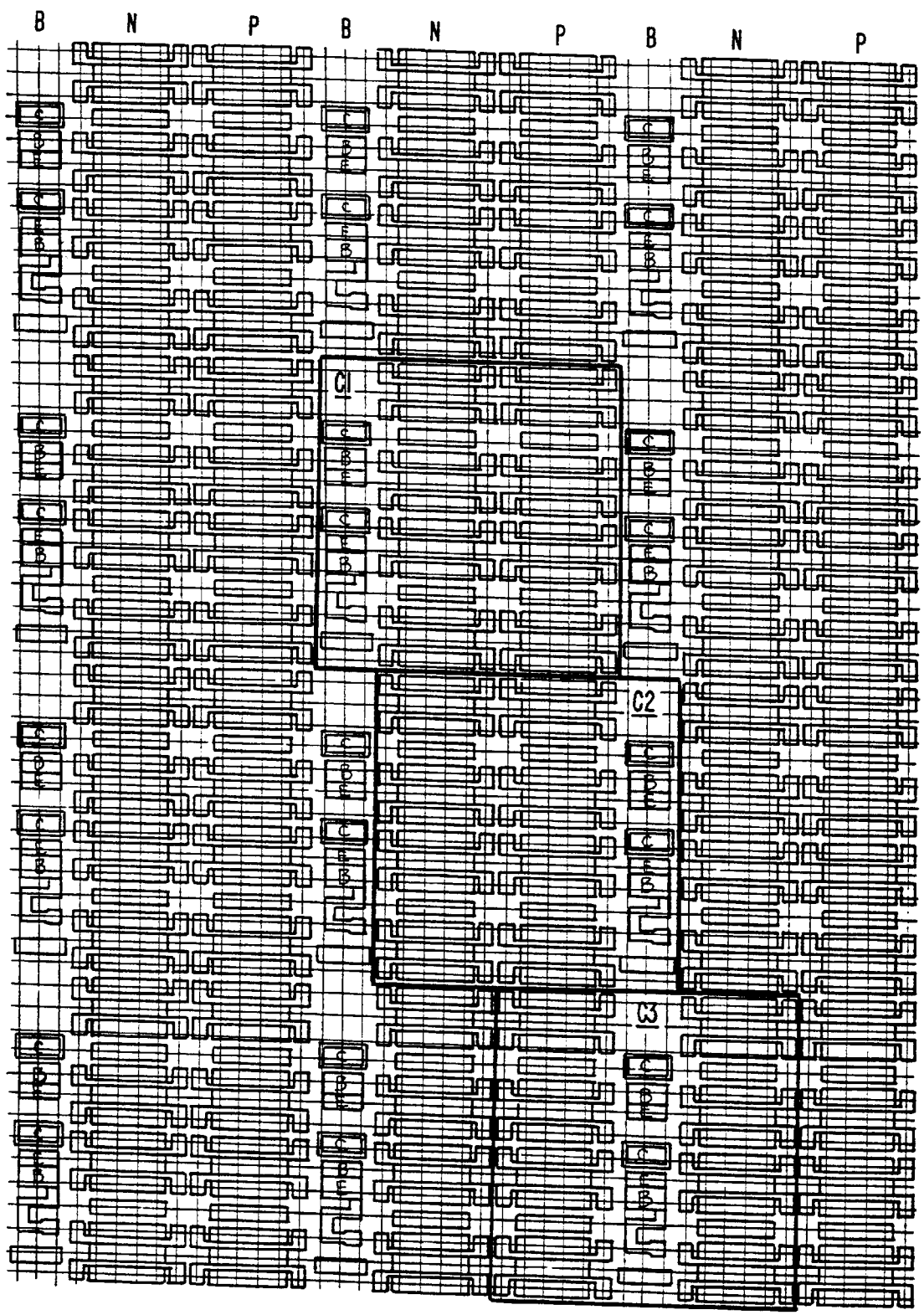
FIG. 4 is a layout of a plurality of FIG. 3 BiCMOS cells according to the present invention.

A top view of a partial logic array with the repeated pattern of the basic cell of FIG. 3 is shown in FIG. 4. Three different versions of the basic cell, C1, C2 and C3, are outlined in FIG. 3. The cell C1 is configured as in FIG. 3 with a bipolar column on the left, an N-Channel column (NMOS transistors) in the middle, and a P-Channel column (PMOS transistors) on the right. In the cell C2 the N-Channel column is on the left, the P-Channel column in the middle and the bipolar column is on the right. The cell C3 has the P-Channel on the left, the bipolar column in the middle and the N-Channel column on the right. Thus even by moving one column left or right, the cell of the present invention is still available to implement most logic functions. Thus present invention allows for space between macrocells flexibly. The space occupied by combinations of three, six, nine, twelve, and so on, conducting lines may used for interconnecting macrocells depending upon which columns are reserved for the macrocells.

This illustrates the flexibility of the present invention. The user of the logic array of FIG. 4 is free to separate the macrocells by an arbitrary number of columns. Thus only the number of routing tracks required to make the interconnections between macrocells is utilized. Unlike the prior art BiCMOS logic arrays, the resulting macrocells in the logic array of the present invention may be compacted for an efficient use of space.

Figure 5A:
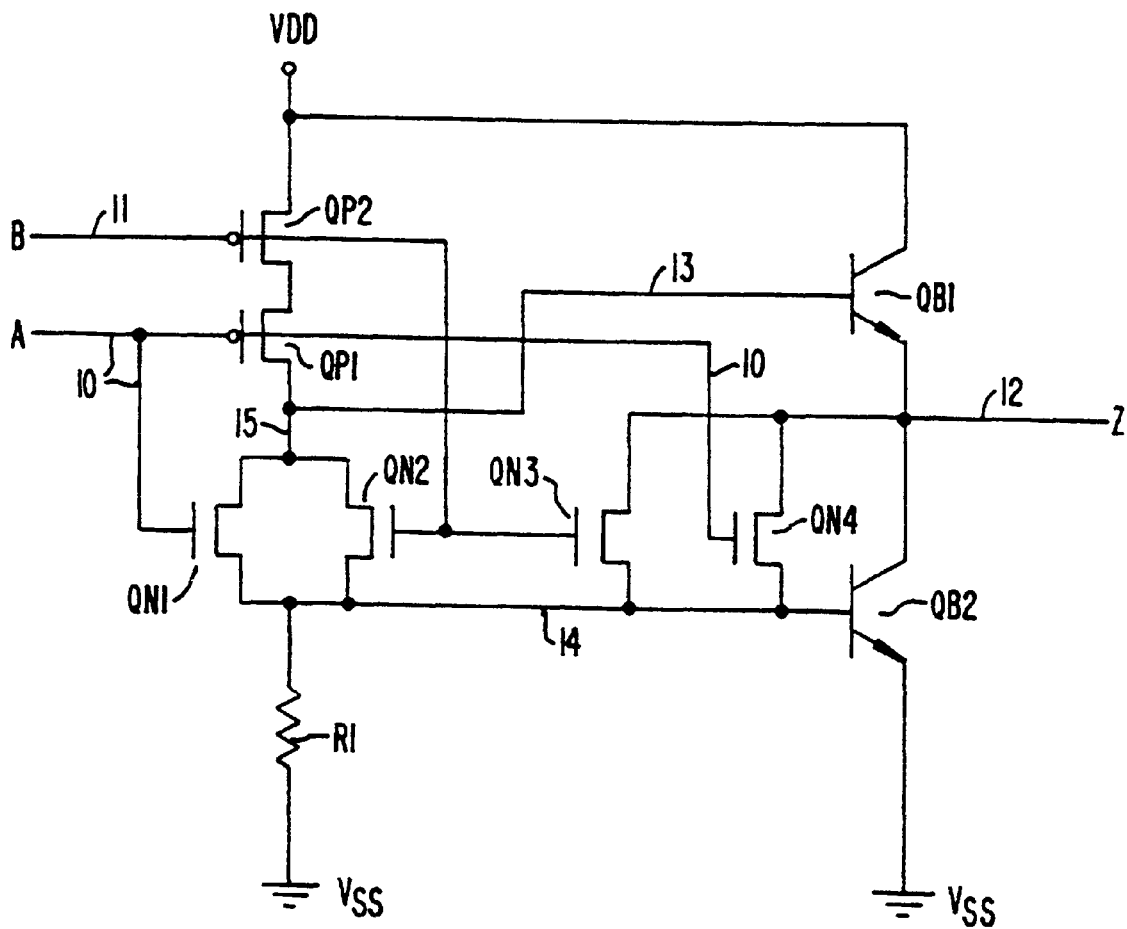
FIG. 5A is a BiCMOS circuit diagram of a 2-input NOR logic gate.

The flexibility of the present invention is further illustrated in FIGS. 5A–5D. FIG. 5A is an exemplary BiCMOS circuit diagram of a two-input NOR logic gate. The NOR logic circuit is connected between a voltage reference at $V_{DD}$ (typically at +5 volts) and a voltage reference at $V_{SS}$ (at ground). The logic circuit has two input terminals for input signals A and B and a terminal for the output signal Z. As in any NOR logic gate, the output signal Z is high only when both input signals A and B are low. Otherwise, the output signal Z is low.

The FIG. 5A circuit has two serially connected PMOS transistors QP1 and QP2. In passing, it should be noted that the PMOS transistors are symbolically indicated by a bubble on the gate electrode of the MOS transistor. The source electrode of the PMOS transistor QP2 is connected to the power supply at $V_{DD}$. The gate electrode of the transistor QP2 is connected to the terminal for the input signal B, while the drain electrode of the transistor QP2 is connected to the source electrode of the PMOS transistor QP1. The transistor QP1 has its gate electrode connected to the terminal for the input signal A and its drain electrode connected to the drain electrodes of two NMOS transistors QN1 and QN2. The source electrodes of both transistors QN1 and QN2 are connected to $V_{SS}$ (ground) through a resistor R1. The gate electrode of the transistor QN1 is connected to the terminal for the input signal A, while the gate electrode of the transistor QP2 is connected to the terminal for the input signal B.

Two other NMOS transistors QN3 and QN4 have their source electrodes connected to $V_{SS}$ through the resistor R1. The transistor QN3 has its gate electrode connected in parallel with the gate electrodes of the transistors QN2 and QP2 to the terminal for the input signal B. The transistor QN4 has its gate electrode connected in parallel to the gate electrodes of the transistors QN1 and QP1 to the terminal for input signal A.

Two bipolar transistors QB1 and QB2 form the output stage of the NOR circuit of FIG. 5A. The first bipolar transistor QB1 has its collector electrode connected to the power supply at $V_{DD}$ and its base electrode connected to a node between the drain electrode of the PMOS transistor QP1 and the drain electrodes of the NMOS transistors QN1 and QN2. The emitter electrode of the transistor QB1 is connected to the terminal for the output signal Z and is also connected to the collector electrode of the second bipolar transistor QB2. The base electrode of that transistor is connected to the source electrodes of the NMOS transistors QN1–QN4 to the power supply at $V_{SS}$ through the resistor R1.

Figure 5B:
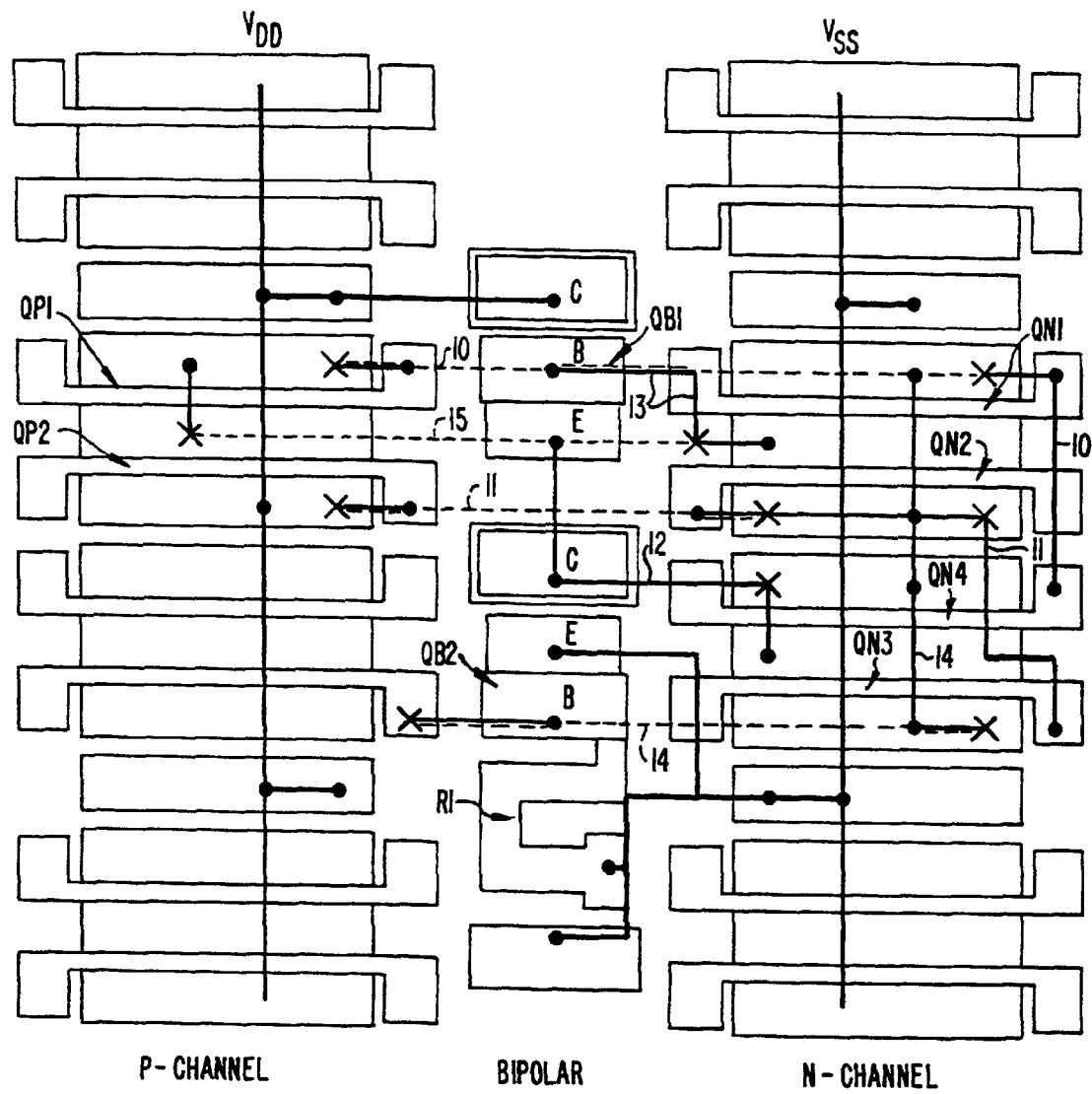
FIGS. 5B, 5C and 5D illustrate the implementation of the logic circuit of FIG. 5A in three different placements of the basic macrocell.
Figure 5C:
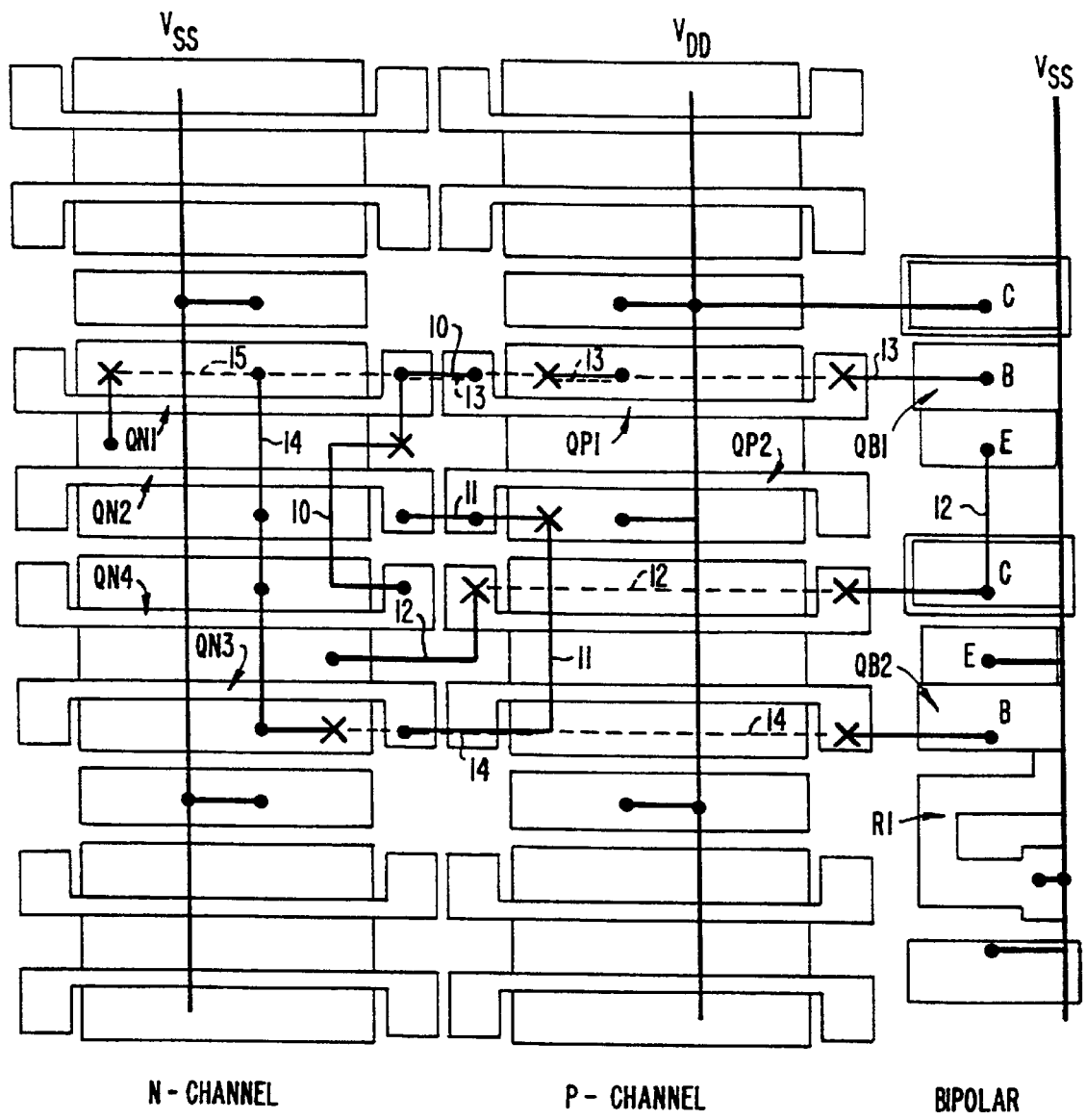
Figure 5D:
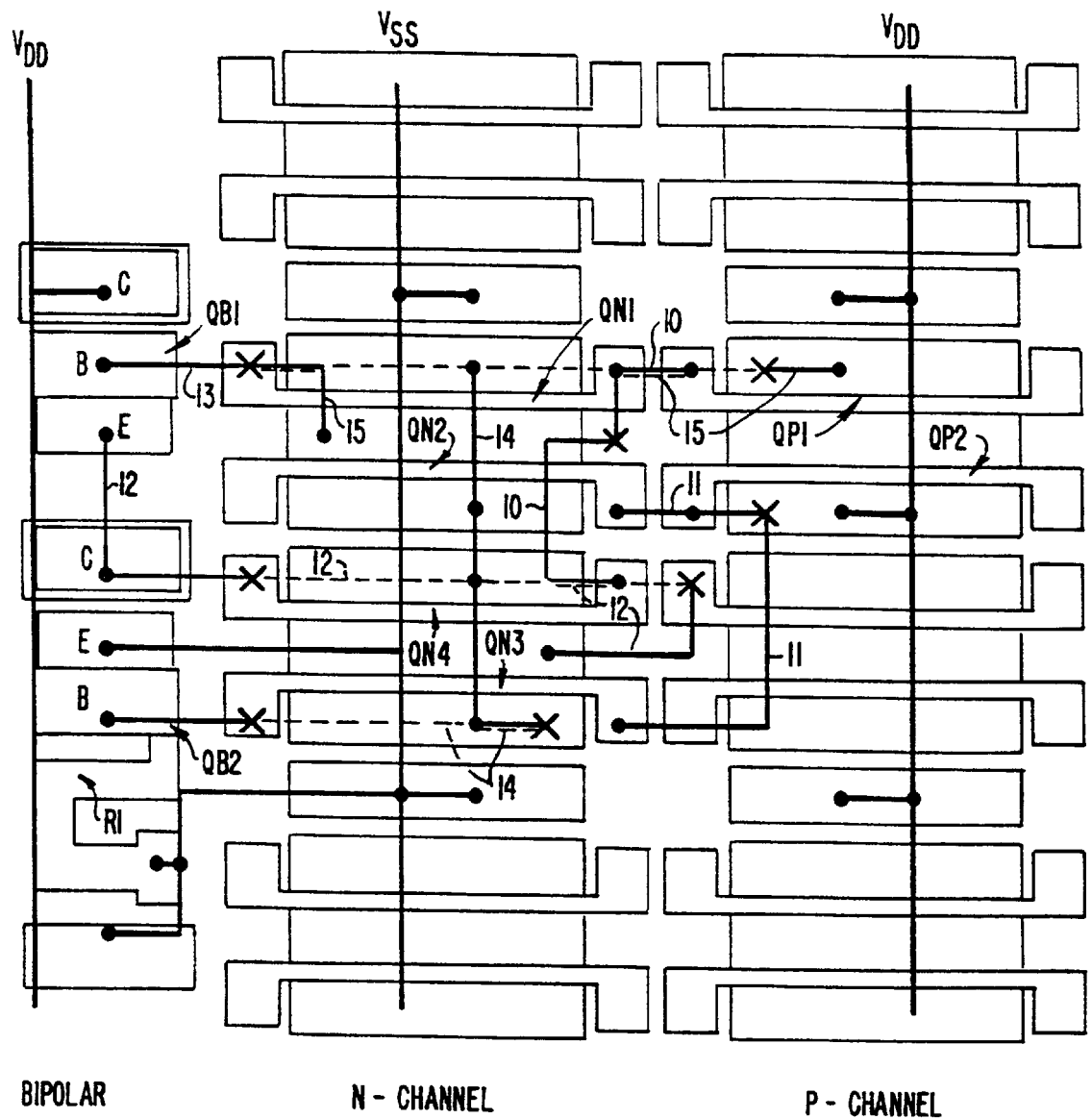

FIGS. 5B, 5C and 5D are exemplary illustrations of how the NOR gate of FIG. 5A can be implemented with the different configurations of the basic cell of the present invention. Solid lines along the routing tracks indicate the presence of a delineated first conducting layer, while a dotted line indicates a delineated second conducting layer above the first conducting layer. A solid line running in parallel with a dotted line indicates that a second conducting line is running in parallel and over a first conducting line. Solid dots indicate contacts to the diffusions in the substrate, such as to an active region, by a conducting line and an "X" indicates a via in the insulating layer separating the two conducting layers for a connection between two conducting lines.

For purposes of identifying the devices of FIG. 5A with the device layouts of FIGS. 5B–5D, the same reference numerals are used in the latter figures as in FIG. 5A. For the MOS transistors, the reference numerals of FIG. 5A are fixed to the gate electrodes of the layouts of FIGS. 5B–5D. For the bipolar transistors, the reference numerals are fixed to the base regions of the bipolar transistor layouts. Furthermore, the conducting lines of the layouts have the same reference numerals as in FIG. 5A.

In the implementation of FIG. 5B the Bipolar column is between the P-channel and N-channel columns. The power supply lines at $V_{DD}$ and $V_{SS}$ run vertically. As one follows the $V_{DD}$ supply line down, the supply line is connected to N-well tap for the PMOS transistor column. It should be noted that to secure the tap to the N-well, the contact to the tap region is made twice. The $V_{DD}$ supply line is connected to the collector region of the bipolar transistor QB1 by a branch line to the right and also contacts the source region for the PMOS transistor QP2 before making a double contact to a second N-well tap region.

On the right of FIG. 5B the $V_{SS}$ supply line first makes a double contact to a tap region for P-well for the NMOS transistor column to the right of the Bipolar column. As one proceeds from the top of FIG. 5B to the bottom of the figure, the $V_{SS}$ supply line makes a double contact to a second tap region to the P-well and, by a branch line to the left, makes contacts to the emitter region of the second bipolar transistor QB2, to the end of the diffused region for the resistor R1 and to a tap region for the second bipolar transistor QB2.

The conducting line 10 which receives the input signal A contacts the right-hand ends of the gate electrodes of the NMOS transistors QN1 and QN4 and runs left to contact the right-hand end of the gate electrode of the PMOS transistor QP1. The conducting line 11 which receives the input signal B contacts the right-hand end of the gate electrode of the NMOS transistor QN3, the left-hand end of the gate electrode of the NMOS transistor QN2, and the right-hand end of the gate electrode of the PMOS transistor QP2.

The conducting line 12 carrying the output signal Z from the NOR logic circuit contacts a common source/drain region between the gate electrodes of the NMOS transistors QN3 and QN4. The line 12 travels upward and to the left for a contact to the collector region of the second bipolar transistor QB2 and to the emitter region of the first bipolar transistor QB1.

The conducting line 13 contacts the base region of the first bipolar transistor QB1 to the source/drain region between the gate electrodes of the NMOS transistors QN1 and QN2. By a via contact the conducting line 15 connects the line 13 to a contact of drain region of the PMOS transistor QP1. By a vertical branch of the conducting line 14 the source regions of the four NMOS transistors QN3, QN4, QN2 and QN1 are connected together; a horizontal branch of the line 14 contacts the base region of the second bipolar transistor QB2.

In the implementation of FIG. 5C the Bipolar column is on the right of the N-Channel and P-Channel columns. Two $V_{SS}$ and one $V_{DD}$ supply lines run vertically. The left $V_{SS}$ supply line contacts the tap regions for the P-well for the NMOS transistors, while the right $V_{SS}$ supply line contacts the emitter region of the second bipolar transistor QB2, the far end of the diffused resistor region for the resistor R1, and the tap region for P-substrate for the second bipolar transistor QB2. The center $V_{DD}$ supply line makes a double contact to a tap region to the N-well for the PMOS transistors and a contact to the collector region of the first bipolar transistor QB1 by a branch to the right. As one proceeds downward in the drawing, the supply line also contacts source region of the PMOS transistor QP2 before making a double contact to another tap region to the N-well.

The conducting line 10 receives the input signal A and contacts the right-hand ends of the gate electrodes of the NMOS transistors QN1 and QN4 by a vertical loop pattern. The line 10 also runs horizontally a short distance from the contact to the transistor QN1 gate electrode to contact the left-hand end of the gate electrode of the PMOS transistor QP1.

The conducting line 11 receives the input signal B and contacts the right-hand end of the gate electrode for the NMOS transistor QN2 and the left-hand end of the gate electrode for the PMOS QP2 a short distance away. The line 11 drops down and turns left for a contact to the right-hand end of the gate electrode of the NMOS transistor QN3.

For the output signal Z, the conducting line 12 starts on the right with contacts to the emitter region of the first bipolar transistor QB1 and the collector region of the second bipolar transistor QB2. The line 12 moves left and downward to contact the source/drain region between the gate electrodes of the NMOS transistors QN3 and QN4.

The lateral conducting line 13 connects the base region of the first bipolar transistor QB1 to the conducting line 15 which is connected to the common source/drain region between the gate electrodes of the NMOS transistors QN1 and QN2. The conducting line 13 is also connected to the drain region of the PMOS transistor QP1. Another lateral conducting line 14 runs horizontally to connect the base region of the second bipolar transistor QB2 to the source regions of the NMOS transistor QN3, QN4, QN2 and QN1 by a vertical branch.

The third implementation in FIG. 5D has the Bipolar column on the left followed by the N-Channel and P-Channel transistor columns as shown in FIG. 3. Two $V_{DD}$ and one $V_{SS}$ supply lines run vertically. The $V_{DD}$ line on the left contacts the collector region of the first bipolar transistor QB1; the $V_{DD}$ line on the right makes double contacts to two tap regions to the N-well for the PMOS transistors. The $V_{DD}$ line also contacts the source region of the PMOS transistor QP2.

The centrally located $V_{SS}$ supply line makes a double contact to two tap regions to the P-well for the NMOS transistors. By a horizontal branch to the left The $V_{SS}$ line also contacts the emitter region of the second bipolar transistor QB2. By another horizontal branch to the left, the $V_{SS}$ line contacts the far end of the diffused region for the resistor R1 and to the tap region for the P-substrate for the bipolar transistors.

The conducting line 10 receiving the input signal A contacts the right end of the gate electrode of the NMOS transistor QN1 and the neighboring left end of the gate electrode of the PMOS transistor QP1. The conducting line 10 then drops down in a loop to contact the right end of the gate electrode of the NMOS transistor QN4. The conducting line 11 receiving the input signal B contacts the right end of the gate electrode of the NMOS transistor QN2 and the neighboring left end of the gate electrode of the PMOS transistor QP2 before looping downward to contact the right end of the gate electrode of the NMOS transistor QN3.

The output signal Z conducting line 12 contacts the emitter region of the first bipolar transistor QB1 and the collector region of the second bipolar transistor QB2. The line 12 then moves to the right horizontally and doubles back downwardly to contact the source/drain region between the gate electrodes of the NMOS transistors QN3 and QN4.

The conducting line 13 in FIG. 5D contacts the base region of the first bipolar transistor QB1 and becomes part of line 15 contacting the common source/drain region between the gate electrodes of the NMOS transistors QN1 and QN2. The line 15 through a via runs rightward in the second conducting layer for a contact to the drain region of the PMOS transistor QP1. The vertical branch of the conducting line 14 moves contacts the source regions of the NMOS transistors QN3, QN4, QN2 and QN1; the horizontal branch of the line 14 contacts the base region of the second bipolar transistor QB2.

Thus the exemplary NOR logic gate circuit of FIG. 5A may be still implemented by simply moving one column to the left or right. One is not required to move more that six routing tracks to implement a macrocell. This flexibility in location of macrocells permits the present invention to interconnect macrocells much closer together than in previous BiCMOS logic arrays.

Figure 6A:
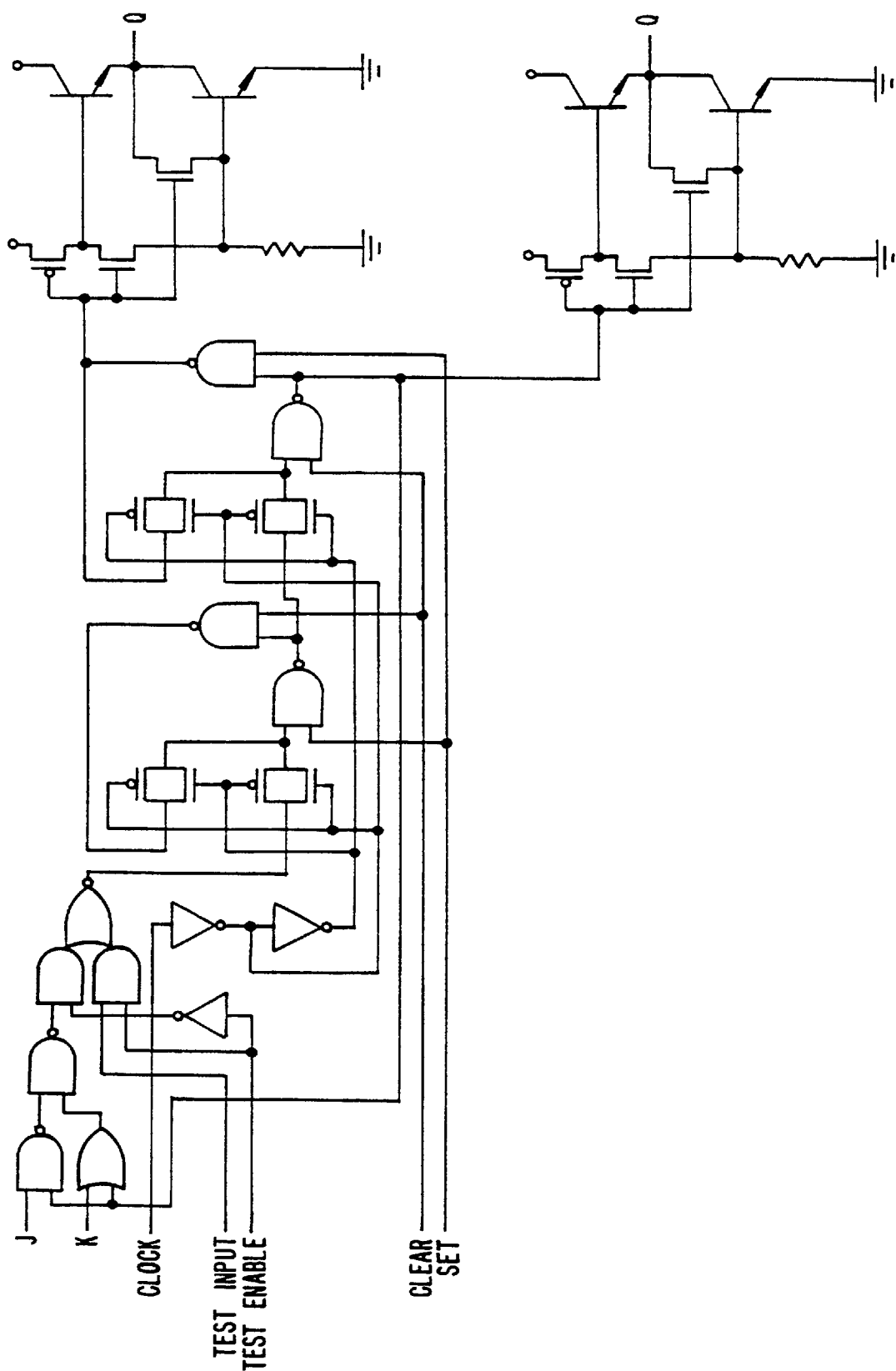
FIG. 6A is a BiCMOS circuit diagram of a J–K flip-flop.
Figure 6B:
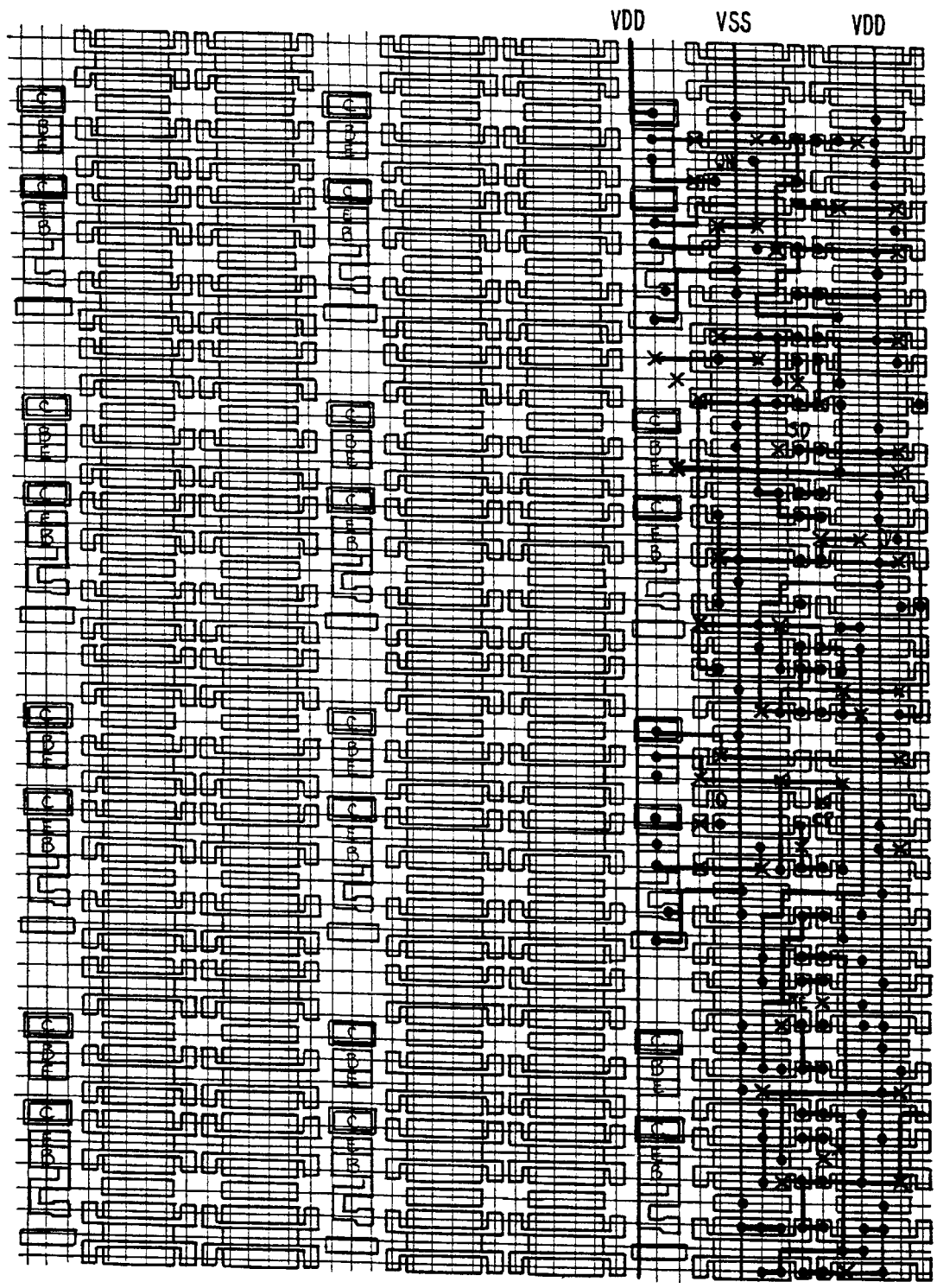
FIGS. 6B and 6C are different macrocell implementations of the flip-flop of FIG. 6A.
Figure 6C:
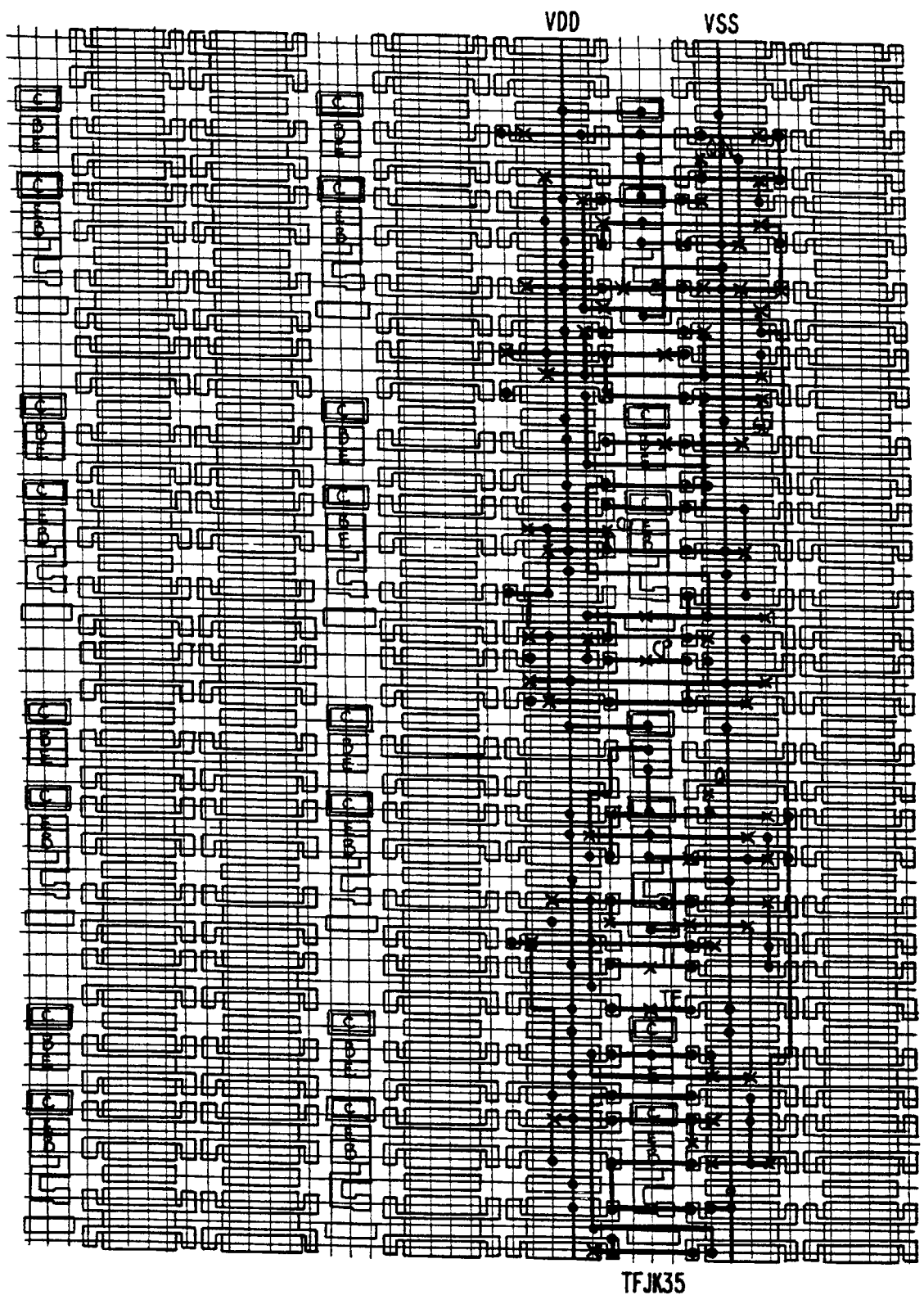

Another example of the flexibility of the present invention is shown in FIGS. 6A–6C. A much more complicated function than a NOR logic gate is a J–K flip-flop whose circuit diagram is shown in FIG. 6A. The circuit has two terminals for input signals J and K, an input terminal for a clock signal, two input terminals for a Test Enable control signal and for a Test Input signal for the test function, and two control input signals for the Clear and Set functions. As can be seen in FIG. 6A, the circuit is quite complex.

FIG. 6B and FIG. 6C illustrate macrocell implementations of the J–K flip-flop circuit of FIG. 6A. In exemplary FIG. 6B the Bipolar column is on the left followed by the N-Channel and P-Channel columns. The macrocell covers several FIG. 3 basic cells. Three voltage supply lines are required, two $V_{DD}$ supply lines and one $V_{SS}$ line, but only three columns (bipolar, N-channel and P-channel) are occupied. With the present invention it is possible that another macrocell to occupy the columns immediately to the right or left of the macrocell of FIG. 6B.

This is true for the second implementation shown in FIG. 6C, which has the Bipolar column in the middle between the P-Channel column on the left and the N-Channel column on the right. Again, the complex macrocell occupies only three columns. Although not shown, the J–K flip-flop circuit may similarly be implemented with the Bipolar column to the right of the N-Channel and P-Channel columns.

Thus, while the invention has been particularly shown and described with reference to the preferred embodiments, it is understood by those skilled in the art that changes in form and details may be made without departing from the spirit of this invention. It is therefore intended that an exclusive right be granted to the invention as limited only by the metes and bounds of the appended claims.

What is claimed is:

1. An integrated circuit logic gate array structure in a semiconductor substrate comprising:

first, second and third columnar regions, cyclically repeating and adjacent to each other, said first columnar region being of a first conductivity type and said second columnar region being of a second conductivity type, said first and second columnar regions having:

active areas formed within said columnar regions such that said active areas in said columnar regions are aligned into rows, each of said active areas having a first source/drain region, a second source/drain region, a third source/drain region, a first channel region between said first and second source/drain regions, a gate formed above said first channel region to control the conductivity of said first channel region, a second channel region between said second and third source/drain regions, and a gate formed above said second region to control the conductivity of said second channel region;

tap regions formed within said columnar regions such that tap regions in said columnar regions are aligned into rows, said tap regions of the same conductivity type as the columnar regions in which they are formed;

said active areas and said tap regions in each columnar region being symmetrical about a center line running the length of each of said columnar regions, one tap region separating two active regions within each of said first and second columnar regions; said third columnar region of said first conductivity type, said third columnar region having a first bipolar transistor and a second bipolar transistor, said third columnar region having:

a collector, base and emitter region of a first bipolar transistor;

a collector, emitter and base region of a second bipolar transistor; and tap regions of the same conductivity type as said third columnar region, one tap region for said collector, base and emitter regions of said first and second bipolar transistors, said collector, base, emitter regions of said first and second bipolar transistors, and said tap regions aligned vertically in said third columnar region.

2. The logic gate array structure as in claim 1 wherein said third columnar region further comprises a diffused resistive region extending from said base region of said second bipolar transistor and of the same conductivity type as said base region.

3. The logic gate array structure as in claim 2 wherein said collector region of said first bipolar transistor and said diffused resistive region are approximately aligned in rows with said tap regions in said first and second columnar regions.

4. The logic gate array structure as in claim 3 wherein said first and second bipolar transistors are NPN transistors, said first conductivity is P-type and said second conductivity is N-type.

5. A repeating cell structure in a semiconductor substrate for a BicMos logic gate array, said cell structure comprising:

a first columnar region of a first conductivity type, said first columnar region having four active areas formed within said columnar region such that said active areas in said columnar region are aligned vertically with respect to each other, each of said active areas having a first source/drain region, a second source/drain region, a third source/drain region, a first channel region between said first and second source/drain regions, a gate formed above said first channel region to control the conductivity of said first channel region, a second channel region between said second and third source/drain regions, and a gate formed above said second region to control the conductivity of said second channel region; and first and second tap regions formed within said columnar region, said tap regions of the same conductivity type as the first columnar region, said first tap region located between the topmost active region and the active region immediately below said topmost active region, said second tap region located between the bottommost active region and the active region immediately above said active region;

said active areas and said tap regions in each columnar region being symmetrical about a center line running the length of each of said columnar regions, one tap region separating two active regions within each of said first and second columnar regions;

a second columnar region of a second conductivity type, said second columnar region having four active areas formed within said second columnar region such that said active areas in said columnar region are aligned vertically with respect to each other, each of said active areas of said second columnar region aligned horizontally with one of said active areas of said first columnar region, each of said active areas of said second columnar regions having a first source/drain region, a second source/drain region, a third source/drain region, a first channel region between said first and second source/drain regions, a gate formed above said first channel region to control the conductivity of said first channel region, a second channel region between said second and third source/drain regions, and a gate formed above said second region to control the conductivity of said second channel region; and first and second tap regions formed within said second columnar region, said tap regions of the same conductivity type as the second columnar region, said first tap region located between the topmost active region and the active region immediately below said topmost active region, said second tap region located between the bottommost active region and the active region immediately above said active region, said first tap region of said second columnar region aligned horizontally with said first tap region of said first columnar region, and said second tap region of said second columnar region aligned horizontally with said second tap region of said first columnar region;

said active areas and said tap regions in each columnar region being symmetrical about a center line running the length of each of said columnar regions, a third columnar region of said first conductivity, said third columnar region having a first bipolar transistor and a second bipolar transistor such that collector, base and emitter regions of said first bipolar transistor and collector, emitter and base regions of said second bipolar transistor; and a tap region of the same conductivity type as said third columnar region, said tap region below said collector, base and emitter regions of said first and second bipolar transistors.

6. The repeating cell structure as in claim 5 wherein said collector, base, and emitter regions of said first bipolar transistor and said collector, emitter and base regions of said second bipolar transistor are aligned vertically in said third columnar region in that order.

7. The repeating cell structure as in claim 6 further comprising a diffused resistive region extending from said base region of said second bipolar transistor and of the same conductivity type as said base region.

8. The repeating cell structure as in claim 5 wherein said collector region of said first bipolar transistor and said diffused resistive region are approximately aligned horizontally with said first and second tap regions respectively in said first and second columnar regions.

9. The repeating cell structure as in claim 8 wherein said first and second bipolar transistors are NPN transistors, said first conductivity is P-type and said second conductivity is N-type.

10. In a repeating BiCMOS logic gate array integrated circuit structure in a semiconductor substrate, said substrate having first and second columnar regions, said first columnar region of a first conductivity type and said second columnar region of a second conductivity type, each of said columnar regions having active regions with gate electrodes vertically separating said active regions into source/drain regions, the improvement comprising:

a third columnar region of said first conductivity type, said third columnar region having a collector, base and emitter region of a first bipolar transistor and a collector, emitter and base region of a second bipolar transistor, said regions aligned vertically in said third columnar region and aligned with respect to said gate electrodes and said source/drain regions of said first and second CMOS regions;

whereby a macrocell can be formed from said first, second and third columnar regions with a grid of vertical and horizontal routing tracks over said columnar regions, no matter what order said columnar regions are located horizontally adjacent to each other.

11. The repeating cell structure as in claim 10 wherein said collector, base, and emitter regions of said first bipolar transistor and said collector, emitter and base regions of said second bipolar transistor are aligned vertically in said third columnar region in that order.

12. The improved structure as in claim 10 wherein said third columnar region further has a tap region of the same conductivity type as said third columnar region, said tap region providing a bias voltage to said third columnar region for electrically separating said collector, base and emitter regions of said first and second bipolar transistors.

13. The improved structure as in claim 12 wherein third columnar region further has a diffused resistive region extending from said base region of said second bipolar transistor and of the same conductivity type as said base region.

14. The improved structure as in claim 13 wherein said collector region of said first bipolar transistor and said diffused resistive region are approximately aligned in rows with said tap regions in said first and second columnar regions.

15. The improved structure as in claim 14 wherein said first and second bipolar transistors are NPN transistors, said first conductivity is P-type and said second conductivity is N-type.

16. The improved structure as in claim 14 wherein first and second columnar regions each have four vertically aligned active regions and first and second tap regions formed within said columnar region, said tap regions of the same conductivity type as said respective columnar region, said first tap region located between the topmost active region and the active region immediately below said topmost active region, said second tap region located between the bottommost active region and the active region immediately above said active region, and wherein said collector region of said first bipolar transistor and said diffused resistive region are approximately aligned horizontally with said first and second tap regions respectively in said first and second columnar regions.

17. The improved structure as in claim 10 wherein said first and second columnar regions each have six vertical routing tracks and said third columnar regions has three vertical routing tracks thereover.

18. The improved structure as in claim 17 wherein said first, second and third columnar regions have fourteen horizontal routing tracks thereover.

19. The improved structure as in claim 16 wherein said first and second columnar regions each have six vertical routing tracks and said third columnar regions has three vertical routing tracks thereover.

20. The improved structure as in claim 19 wherein said first, second and third columnar regions have fourteen horizontal routing tracks thereover.

* * * * *